United States Patent [19]

Threewitt et al.

[11] Patent Number: 4,791,606

[45] Date of Patent: Dec. 13, 1988

[54] HIGH DENSITY CMOS DYNAMIC CAM CELL

[75] Inventors: N. Bruce Threewitt; Simon M. Price, both of Colorado Springs, Colo.

[73] Assignee: Triad Semiconductors International BV, Colorado Springs, Colo.

[21] Appl. No.: 92,078

[22] Filed: Sep. 1, 1987

[51] Int. Cl.⁴ .............................................. G11C 15/00
[52] U.S. Cl. ........................................ 365/49; 365/51; 365/189
[58] Field of Search ................... 365/51, 49, 189, 230

[56] References Cited

U.S. PATENT DOCUMENTS 4,559,618 12/1985 Houseman et al. ................. 365/49

Primary Examiner—Terrell W. Fears
Attorney, Agent, or Firm—Flehr, Hohbach, Test, Albritton & Herbert

[57] ABSTRACT

A CMOS dynamic content addressable memory (CAM), having N- and P-channel transistors aligned in stripes for high packing density. In a preferred embodiment, each cell has a four transistor XOR gate for comparing a stored data bit with a comparand bit. Packing density is improved by symmetrically arranging each pair of neighboring rows and each pair of neighboring columns. The device, being of CMOS construction, has an inherently low soft error rate.

4 Claims, 2 Drawing Sheets

IMPROVED CAM CELL ARRAY (8 CELLS)

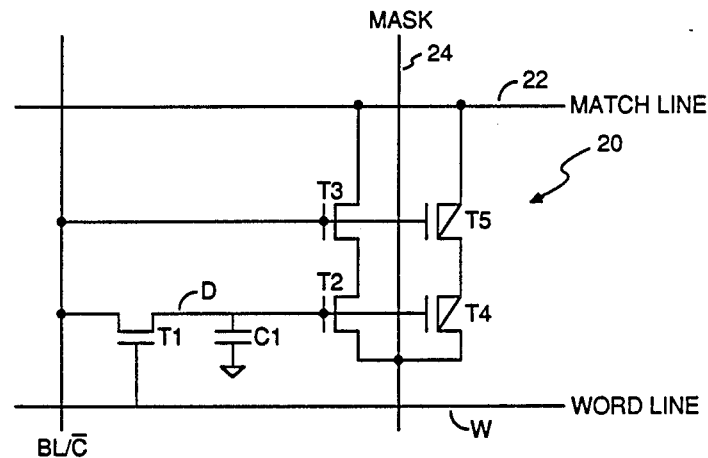
*FIGURE 1*
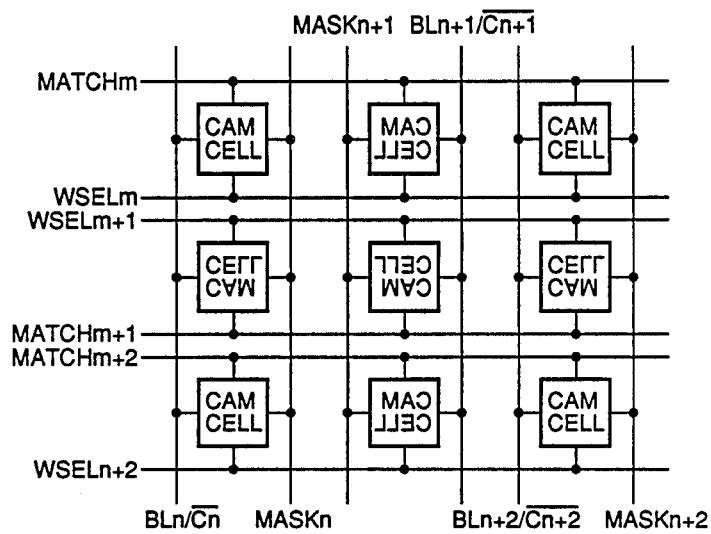
*FIGURE 2. 3 X 3 ARRAY OF CAM CELLS*

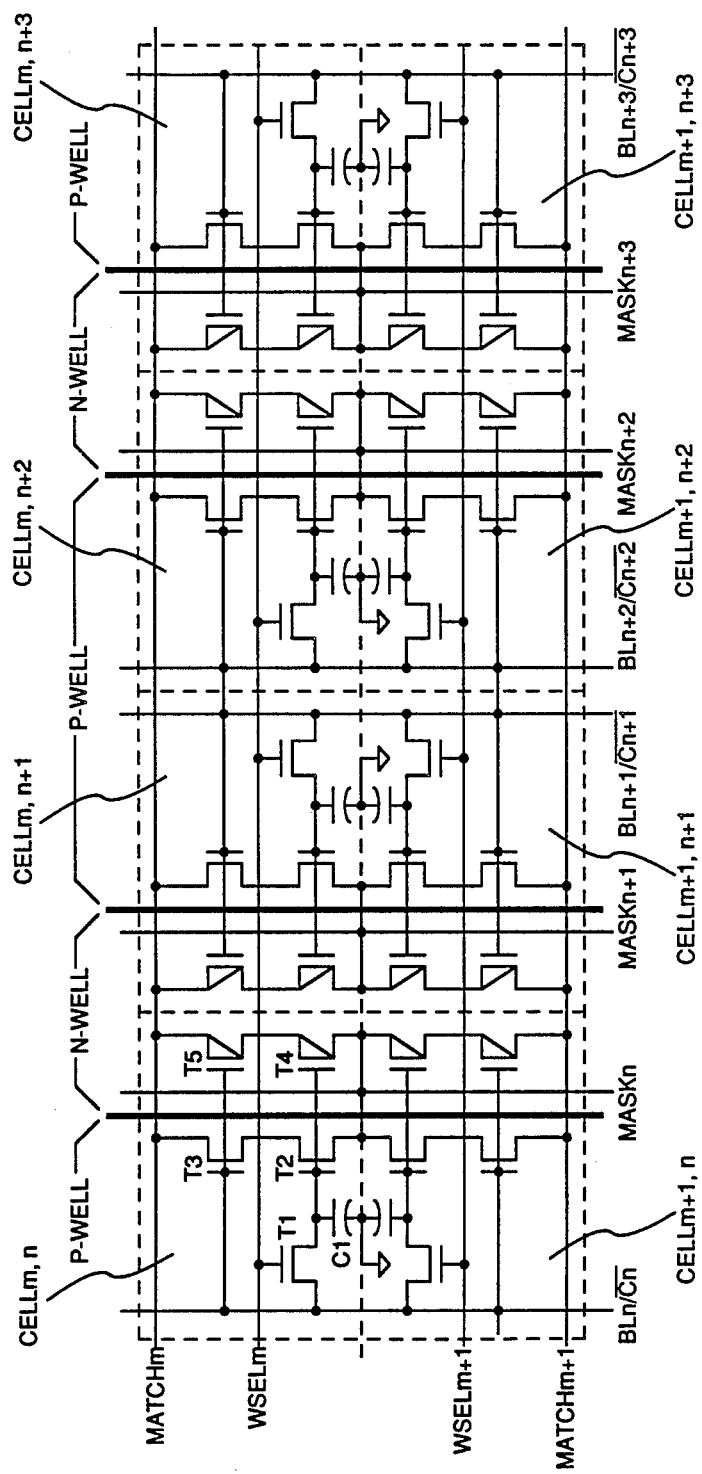
FIGURE 3. IMPROVED CAM CELL ARRAY (8 CELLS)

HIGH DENSITY CMOS DYNAMIC CAM CELL

The present invention relates generally to computer memory devices which are content addressable, and particularly to a dynamic content addressable memory using CMOS transistors.

BACKGROUND OF THE INVENTION

A content addressable memory (CAM) is generally a memory device with two modes of access. In one mode, the CAM works as a normal random access memory—the contents of the memory are read and written at specified addresses. In a second mode, the CAM compares a specified string, often called the comparand, with the information stored in its memory cells and then generates signals which indicate if a match (i.e., between the comparand and any of the information in the memory) was found.

The present invention concerns the application of dynamic MOS memory technology to CAM cells. The inventors know of only four MOS dynamic CAM cells which have been described in the literature: J. L. Mundy, U.S. Pat. No. 3,701,980 (1972, assignee: General Electric Co.); R. M. Lea: "A Design for a Low-Cost, High-Speed MOS Associative Memory," *The Radio and Electronic Engineer*, Vol. 45, No. 4, April 1975; Y. Lavi, U.S. Pat. No. 4,377,855, granted 1983 (Assignee: National Semiconductor Corp.); J. P. Wade and C. G. Sodini, "Dynamic Cross-Coupled Bit-Line Content Addressable Memory Cell for High-Density Arrays," *IEEE Journal of Solid State Circuits*, Vol. SC-22, No. 1, February 1987. All of the dynamic CAM (DCAM) cells described in these references were designed using NMOS technology.

The primary goal of using dynamic memory technology, rather than static memory technology, is to achieve greater packing density. With regard to other (not CAM) memories, dynamic random access memory (DRAM) devices typically have four times the storage capacity of static random access memories (SRAM) using comparable technology. This capacity advantage, however, is bought at the expense of the need to refresh the dynamic storage element—a capacitor with a capacitance of about 50 femtofarads. Furthermore, dynamic memories have higher "soft error" rates because DRAM cells have a higher susceptibility to being affected by alpha-particle bombardment.

It is also known that CMOS dynamic memory devices have higher alpha-particle immunity than other dynamic memory devices, because the storage element in CMOS memories resides in a potential well which protects it from the electrical effects induced by alpha-particle bombardment.

The problem addressed by the present invention is that, in the prior art, the cell area advantage of dynamic CAM cells over static CAM cells is less than in the case of RAM technology. The dynamic CAM (DCAM) cells have not provided a sufficient cell area advantage to be commercially viable primarily because of the large area occupied by the comparison circuitry needed in every memory cell.

SUMMARY OF THE INVENTION

In summary, the present invention is a CMOS dynamic CAM memory array, having N- and P-channel transistors aligned in stripes for high packing density. In a preferred embodiment, each cell has a four transistor exclusive-OR (XOR) gate for comparing stored data with a comparand. Packing density is improved by symmetrically arranging each pair of neighboring rows and each pair of neighboring columns. The device, being of CMOS construction, has an inherently low soft error rate.

BRIEF DESCRIPTION OF THE DRAWINGS

Additional objects and features of the invention will be more readily apparent from the following detailed description and appended claims when taken in conjunction with the drawings, in which:

FIG. 1 depicts a dynamic content addressable memory cell in accordance with the present invention.

FIG. 2 depicts a 3×3 array of CAM cells.

FIG. 3 depicts the general layout organization of a dynamic CAM array in accordance with the present invention.

DESCRIPTION OF THE PREFERRED EMBODIMENT

The present invention is a memory device formed on a semiconductor substrate, using both N-channel and P-channel IGFETs (isolated gate field effect transistors). In the preferred embodiment, the substrate is silicon.

Furthermore, regardless of the manufacturing process used, N-channel and P-channel IGFET transistors are herein called NMOS and PMOS transistors.

Referring to FIG. 1, there is shown a CAM cell 20 comprising five transistors T1–T5 and a capacitor C1. Transistor T1 and capacitor C1 form a dynamic memory cell, with transistor T1 coupling the bit line BL/$\overline{C}$ to the storage node D when the word line W is enabled. The cell 20 may be randomly accessed (i.e., read from and written to) in the same way as a conventional DRAM cell. As with standard DRAM cells, the cell 20 must be periodically refreshed.

Note that the bit line is labeled BL/$\overline{C}$ because this same line is also used to transmit the inverse of the comparison data to the cell. While, for convenience, data transmitted on the BL/$\overline{C}$ line is herein called "the comparison data", this data is actually the inverse of the comparand for which a match is being searched.

The comparison operation of the cell 20 is performed by transistors T2–T5, which operate as an exclusive-NOR (XNOR) gate. Transistors T2 and T3 are serially connected enhancement mode NMOS transistors which couple the Match line 22 to the Mask line 24 when both the stored data on node D and the data on line BL/$\overline{C}$ are HIGH. Transistors T4 and T5 are serially connected enhancement mode PMOS transistors which couple the Match line 22 to the Mask line 24 when both the stored data on node D and the data on line BL/$\overline{C}$ are LOW. As described below, when the cell 20 is used in a comparison operation, Mask line 24 is held LOW.

When a comparison is to be performed, the voltage on the Match line is sensed after the comparison data is asserted on line BL/$\overline{C}$. If the comparison operation results in a "match", the voltage on the Match line 22 will remain HIGH; but if the comparison data and the stored data do not match, the Match line will be pulled LOW (or, at least to a lower voltage if dynamic sensing is used).

To withdraw the cell 20 from comparison, the Mask line 24 for the cell is enabled, i.e., set to a HIGH voltage. As can be seen in FIG. 1, when Mask line 24 is set to a HIGH voltage, neither transistor pair T2–T3 nor T4-T5 can pull Match line 22 LOW—rendering the cell 20 inoperative during comparison operations.

When the cell 20 is to be used in a comparison operation, the Mask line 24 is set LOW so that the Match line 22 can be pulled LOW through transistors T2 and T3, or T4 and T5, if the data stored in the memory cell on storage node D does not "match" the comparison data on the BL/$\overline{C}$ line.

As noted above, the comparison data on the BL/$\overline{C}$ line is inverted. Thus the comparison data physically present on line BL/$\overline{C}$ will "match" the stored data in the cell 20 if the two are in opposite logical states.

In other words, using normal high/low logic, the data stored in the memory is denoted D, the comparison data is denoted C, and the inverted comparison data on BL/$\overline{C}$ is denoted $\overline{C}$. When a comparison is to be performed, the Match line 22 is first pulled HIGH, and then the inverted comparison data is put on the BL/$\overline{C}$ line. If C equals D (i.e., $\overline{C}$ is not equal to D) then the Match line 22 remains HIGH, otherwise, the Match line 22 is pulled LOW:

If C=D (i.e., $\overline{C} \neq$ D) then Match=HIGH.

If C$\neq$D (i.e., $\overline{C}$=D) then Match=LOW.

Match=$\overline{C}$ XOR D=C XNOR D

Thus it can be seen that transistors T2-T5 can be characterized equally well as an exclusive-OR (XOR) or as an exclusive-NOR (XNOR) gate, depending on the polarity of the logical signals being used.

It should be noted that there will normally be a multiplicity of CAM cells coupled to the Match line. If the data in any one of these cells does not match its comparison data, and that cell is not masked, the Match line 22 will be pulled LOW. All the cells which have a common Match line are typically called one "word". When a comparand is entered into the cam system, only those words which have the same contents as the comparand in unmasked bit locations will have Match lines which remain HIGH.

It should also be noted that the storage capacitor C1 in each cell 20 needs only to be a.c. coupled to ground—a true ground connection need not be used. Thus, the low voltage terminal of the capacitor C1 is connected in the preferred embodiment to a relatively high resistance polysilicon plate which is connected to a fixed voltage potential—i.e., the ground pin for the memory. This characteristic is identical to the well known techniques employed in dynamic RAM designs.

As will be understood by those skilled in the art, a CAM with X words will have X Match lines. All the match lines are coupled to a priority encoder so that if a plurality of matching words are found, the matching words can be accessed sequentially in accordance with a specified priority scheme.

Note that the CAM cell could, at least potentially, not use a separate capacitor C1 if the parasitic capacitance $C_{gs}$ of transistors T2 and T4 is sufficient to reliably store data in node D over the full range of operating conditions specified for the CAM device.

In the preferred embodiment, the CAM cell 20 does include a capacitor. Using the layout scheme described below with respect to FIG. 3, the capacitors are fabricated using well known techniques employed in dynamic RAM manufacturing.

Referring to FIG. 2, in the preferred layout of the cells in an array, each pair of neighboring rows (of cells) is symmetrically placed. Similarly, each pair of neighboring columns is symmetrically placed. In other words, the layout of each column is the mirror image of its neighboring column(s), and the layout of each row is the mirror image of its neighboring row(s).

Referring to FIG. 3, there is shown a schematic layout pattern for eight cells arranged in a 2×4 array. The match lines are labeled MATCHm and MATCHm+1; the word lines are labeled WSELm and WSELm+1; the bit lines are labeled BLn/$\overline{Cn}$ through BLn+3/$\overline{Cn+3}$; and the Mask lines are labeled MASKn through MASKn+3.

The symmetrical layout pattern shown in FIGS. 2 and 3 allows the use of alternating P-well and N-well regions, here shaped as parallel stripes. Each stripe serves two columns of memory cells. Specifically, the transistors in the array are located in alternating P-well and N-well regions, each P-well region and N-well region running the length of the array columns and holding all the transistors of corresponding channel type for two neighboring columns of cells.

The alignment of P-well regions (for NMOS transistors) and N-well regions (for PMOS transistors) improves memory density compared with other designs considered by the inventors, because the spacing overhead associated with isolating PMOS from NMOS devices is shared by neighboring cells. Also, row symmetry allows (1) each a.c. ground connection for the storage capacitors to serve two memory cells; and (2) each Mask line connection to serve two memory cells.

It should also be noted that the stripe layout scheme shown allows the use of self-aligned transistor fabrication.

In summary, the present invention is a dynamic CAM cell using CMOS transistors in the comparison circuitry to provide sufficiently high cell density to make the use of dynamic CAM cells commercially practical.

While the present invention has been described with reference to a few specific embodiments, the description is illustrative of the invention and is not to be construed as limiting the invention. Various modifications may occur to those skilled in the art without departing from the true spirit and scope of the invention as defined by the appended claims.

What is claimed is:

1. A content addressable memory comprising an array of memory cells arranged in a plurality of rows and a plurality of columns of cells, a bit line for each column of cells, a word line for each row of cells, and a match line for each row of cells; each said cell consisting essentially of:

a dynamic storage element suitable for storing a data bit, an access transistor having a gate electrode coupled to the corresponding word line, said access transistor coupling the corresponding bit line to said dynamic storage element when said access transistor is enabled, and a logic gate coupled to said dynamic storage element, said corresponding bit line, and said corresponding match line, for comparing the contents of said dynamic storage element with a comparand bit on said bit line and for changing the state of said match line if said comparand bit does not match the contents of said dynamic storage element, said logic gate comprising a plurality of transistors including at least one N-channel transistor and one P-channel transistor;

wherein each column of said cells is arranged so that it is symmetrically placed with respect to its neighboring columns; and the transistors in said array are located in alternating P-well and N-well regions, each P-well region and N-well region running the length of said columns and holding all the transistors of corresponding channel type for two neighboring columns of cells.

2. A content addressable memory as set forth in claim 1, further including one mask line for each column of cells;

wherein said logic gate consists essentially of a first N-channel transistor and a first P-channel transistor, both having gate electrodes coupled to said storage element and both having source electrodes coupled to the corresponding mask line for said cell; and a second N-channel transistor and a second P-channel transistor, both having gate electrodes coupled to the corresponding bit line, both having drain electrodes coupled to the corresponding match line for said cell, and each having a source electrode coupled to the drain electrode of said first transistor of the same channel type.

3. A content addressable memory comprising an array of memory cells arranged in a plurality of rows and a plurality of columns of cells, a bit line for each column of cells, a word line for each row of cells, and a match line for each row of cells;

each said cell consisting essentially of:

a dynamic storage element suitable for storing a data bit, an access transistor having a gate electrode coupled to the corresponding word line, said access transistor coupling the corresponding bit line to said dynamic storage element when said access transistor is enabled, an exclusive-OR (XOR) gate coupled to said dynamic storage element, said corresponding bit line, and said corresponding match line; for comparing the contents of said dynamic storage element with a comparand bit on said bit line and for changing the state of said match line if said comparand bit does not match the contents of said dynamic storage element, said XOR gate comprising two N-channel transistors and two P-channel transistors;

wherein each column of said cells is arranged so that it is symmetrically placed with respect to its neighboring columns; and the transistors in said array are located in alternating P-well and N-well regions, each P-well region and N-well region running the length of said columns and holding all the transistors of corresponding channel type for two neighboring columns of cells.

4. A content addressable memory as set forth in claim 3, further including one mask line for each column of cells;

wherein said XOR gate consists essentially of a first N-channel transistor and a first P-channel transistor, both having gate electrodes coupled to said storage element and both having source electrodes coupled to the corresponding mask line for said cell; and a second N-channel transistor and a second P-channel transistor, both having gate electrodes coupled to the corresponding bit line, both having drain electrodes coupled to the corresponding match line for said cell, and each having a source electrode coupled to the drain electrode of said first transistor of the same channel type.

* * * * *